United States Patent
Pramod et al.

(10) Patent No.: US 10,340,827 B2
(45) Date of Patent: Jul. 2, 2019

(54) FAULT TOLERANT CURRENT MEASUREMENT IN MOTOR CONTROL SYSTEMS

(71) Applicant: STEERING SOLUTIONS IP HOLDING CORPORATION, Saginaw, MI (US)

(72) Inventors: Prerit Pramod, Saginaw, MI (US); Varsha Govindu, Saginaw, MI (US)

(73) Assignee: STEERING SOLUTIONS IP HOLDING CORPORATION, Saginaw, MI (US)

( * ) Notice: Subject to any disclaimer, the term of this patent is extended or adjusted under 35 U.S.C. 154(b) by 0 days.

(21) Appl. No.: 15/804,253

(22) Filed: Nov. 6, 2017

(65) Prior Publication Data
US 2019/0140566 A1    May 9, 2019

(51) Int. Cl.
H02P 6/28 (2016.01)
G01R 31/28 (2006.01)
H02P 6/24 (2006.01)

(52) U.S. Cl.
CPC .......... H02P 6/28 (2016.02); G01R 31/2829 (2013.01); H02P 6/24 (2013.01)

(58) Field of Classification Search
CPC ..... G01R 31/00; G01R 31/2829; H02P 27/06; H02P 21/22; H02P 6/28; H02P 29/024
See application file for complete search history.

(56) References Cited

U.S. PATENT DOCUMENTS

| | | | | |
|---|---|---|---|---|
| 5,927,430 A * | 7/1999 | Mukai | ................ | B62D 5/0463 180/446 |
| 6,593,714 B2 * | 7/2003 | Nagayama | ............ | H02P 21/22 318/400.03 |
| 7,091,684 B2 * | 8/2006 | Kobayashi | ............ | B62D 5/046 318/139 |
| 7,161,323 B2 * | 1/2007 | Ajima | ................ | B62D 5/046 318/560 |
| 7,990,093 B2 * | 8/2011 | Kezobo | ................ | B62D 5/0484 318/432 |
| 8,593,093 B2 * | 11/2013 | Hisano | ................ | H02P 29/032 318/400.01 |
| 8,867,181 B2 * | 10/2014 | Hasan | ................ | H02H 7/00 361/31 |
| 9,806,656 B1 * | 10/2017 | Pramod | ................ | H02P 23/14 |
| 10,090,779 B2 * | 10/2018 | Kwak | ............... | H02M 7/53875 |
| 2013/0077194 A1 * | 3/2013 | Hasan | ................ | H02H 7/00 361/31 |

* cited by examiner

*Primary Examiner* — Thai T Dinh
(74) *Attorney, Agent, or Firm* — Cantor Colburn LLP

(57) ABSTRACT

Technical solutions are described for determining a sensor failure in a motor control system with at least three phase current measurements. An example system includes a current controller to generate an input voltage command for a motor using feedforward control. The system further includes a failed sensor identification module that, in response to the current controller operating using the feedforward control, determines that a current offset error is indicative of a failure of a current sensor, the current offset error determined based on a magnitude and a phase of a diagnostic current. Further, the failed sensor identification module identifies the current sensor experiencing the failure based on a phase value of the diagnostic current in response to the failure.

20 Claims, 9 Drawing Sheets

FAULT TOLERANT CURRENT MEASUREMENT IN MOTOR CONTROL SYSTEMS

BACKGROUND

The present application generally relates to fault tolerant current measurement in motor control systems, such as in case of current sensor fault.

Typically, a motor control system, such as in an electric power steering (EPS) system, controls an electric motor by applying voltage to the electric motor. For example, an EPS system uses the electric motor to provide steering assist to an operator of a steering wheel of a vehicle using a method of torque control. When using a Permanent Magnet Synchronous Machine (PMSM), Field Oriented Control (FOC) is utilized to allow the alternating current (AC) three-phase motor voltage and current signals to be transformed into a synchronously rotating reference frame, commonly referred to as the d/q axis reference frame. In a d/q axis reference frame, the motor voltages and currents become direct current (DC) quantities. The FOC torque control technique is commonly implemented either using feedforward methods of control or a closed loop current feedback control.

When the FOC torque control is implemented through a closed loop current control, the implementation employs high performance current regulators that minimize the error between commanded and measured currents to achieve perfect current tracking. Thus, current control requires the motor currents to be measured, which is typically achieved by measuring the phase currents of the electric machine, which are then transformed into the synchronous frame via the Park Transform to perform the control in the synchronous reference frame.

Accordingly, it is desirable to have motor control systems to have fault tolerant current measurement strategies in case of a fault/loss of one or more current measurement sensors, or other equipment used for measuring the current values.

SUMMARY

One or more embodiments are described for determining a sensor failure in a motor control system with at least three phase current measurements. An example system includes a current controller to generate an input voltage command for a motor using feedforward control. The system further includes a failed sensor identification module that, in response to the current controller operating using the feedforward control, determines that a current offset error is indicative of a failure of a current sensor, the current offset error determined based on a magnitude and a phase of a diagnostic current. Further, the failed sensor identification module identifies the current sensor experiencing the failure based on a phase value of the diagnostic current in response to the failure.

An example method for determining a sensor failure in a motor control system with at least three phase current measurements includes generating, by a current controller module, an input voltage command for a motor using feedforward control based on a measured motor current. The method further includes identifying, by a failed sensor identification module, a specific current sensor that is experiencing a failure while the motor control system operates using the feedforward control. The identification includes determining that the current offset error is indicative of the failure based on the magnitude of a diagnostic current. The identification further includes identifying the current sensor experiencing the failure based on a phase value of the diagnostic current in response to the single point failure.

An example motor control system, includes a motor, and a current controller module that generates an input voltage command for the motor using feedback control based on a measured motor current. The motor control system further includes a current measurement and diagnostic calculation module that detects an offset error. The motor control system further includes a failed sensor identification module that, in response to the offset error, switches the current controller module to operate using feedforward control. The failed sensor identification module further determines, when operating in the feedforward control, a failure based on a magnitude of a diagnostic current being above a first predetermined threshold, and in response identify a current sensor experiencing the failure based on a phase value of the diagnostic current.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

As used herein the terms module and sub-module refer to one or more processing circuits such as an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the sub-modules described below can be combined and/or further partitioned.

Figure 1:
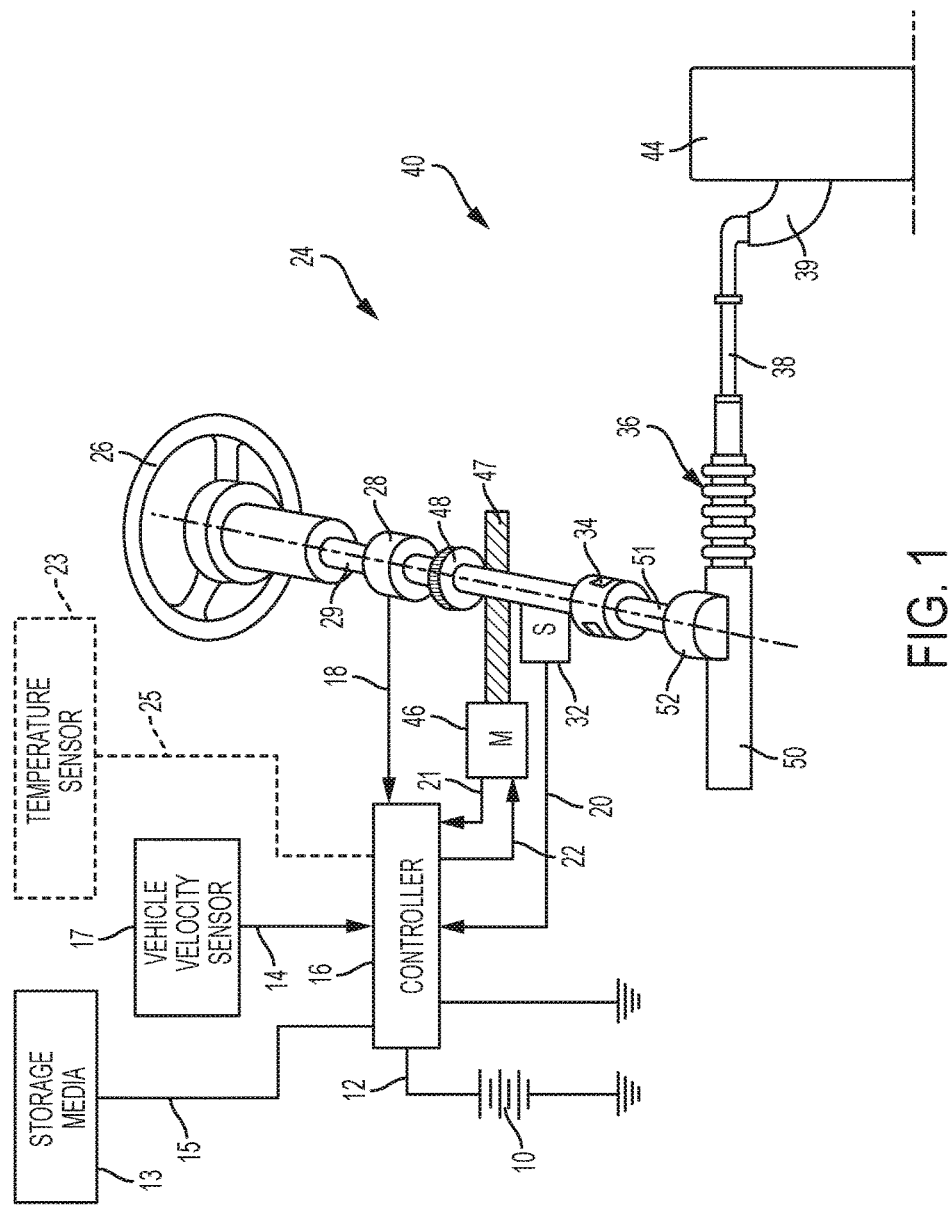
FIG. 1 is an exemplary embodiment of a steering system.

Referring now to the Figures, where the technical solutions will be described with reference to specific embodiments, without limiting same, FIG. 1 is an exemplary embodiment of an electric power steering system (EPS) 40 suitable for implementation of the disclosed embodiments. The steering mechanism 36 is a rack-and-pinion type system and includes a toothed rack (not shown) within housing 50 and a pinion gear (also not shown) located under gear housing 52. As the operator input, hereinafter denoted as a steering wheel 26 (e.g. a hand wheel and the like) is turned, the upper steering shaft 29 turns and the lower steering shaft 51, connected to the upper steering shaft 29 through universal joint 34, turns the pinion gear. Rotation of the pinion gear moves the rack, which moves tie rods 38 (only one shown) in turn moving the steering knuckles 39 (only one shown), which turn a steerable wheel(s) 44 (only one shown).

Electric power steering assist is provided through the control apparatus generally designated by reference numeral 24 and includes the controller 16 and an electric machine 46, which could be a permanent magnet synchronous motor, a permanent magnet direct current motor, a switched reluctance motor, or any other type of motor, are is hereinafter denoted as motor 46. The controller 16 is powered by the vehicle power supply 10 through line 12. The controller 16 receives a vehicle speed signal 14 representative of the vehicle velocity from a vehicle velocity sensor 17. Steering angle is measured through position sensor 32, which may be an optical encoding type sensor, variable resistance type sensor, or any other suitable type of position sensor, and supplies to the controller 16 a position signal 20. Motor velocity may be measured with a tachometer, or any other device, and transmitted to controller 16 as a motor velocity signal 21. A motor velocity denoted $\omega_m$ may be measured, calculated or a combination thereof. For example, the motor velocity $\omega_m$ may be calculated as the change of the motor position $\theta$ as measured by a position sensor 32 over a prescribed time interval. For example, motor speed $\omega_m$ may be determined as the derivative of the motor position $\theta$ from the equation $\omega_m = \Delta\theta/\Delta t$ where $\Delta t$ is the sampling time and $\Delta\theta$ is the change in position during the sampling interval. Alternatively, motor velocity may be derived from motor position as the time rate of change of position. It will be appreciated that there are numerous well-known methodologies for performing the function of a derivative.

As the steering wheel 26 is turned, torque sensor 28 senses the torque applied to the steering wheel 26 by the vehicle operator. The torque sensor 28 may include a torsion bar (not shown) and a variable resistive-type sensor (also not shown), which outputs a variable torque signal 18 to controller 16 in relation to the amount of twist on the torsion bar. Although this is one type of torque sensor, any other suitable torque-sensing device used with known signal processing techniques will suffice. In response to the various inputs, the controller sends a command 22 to the electric motor 46, which supplies torque assist to the steering system through worm 47 and worm gear 48, providing torque assist to the vehicle steering.

It should be noted that although the disclosed embodiments are described by way of reference to motor control for electric steering applications, it will be appreciated that such references are illustrative only and the disclosed embodiments may be applied to any motor control application employing an electric motor, e.g., steering, valve control, and the like. Moreover, the references and descriptions herein may apply to many forms of parameter sensors, including, but not limited to torque, position, speed and the like. It should also be noted that reference herein to electric machines including, but not limited to, motors, hereafter, for brevity and simplicity, reference will be made to motors only without limitation.

In the control system 24 as depicted, the controller 16 utilizes the torque, position, and speed, and like, to compute a command(s) to deliver the required output power. Controller 16 is disposed in communication with the various systems and sensors of the motor control system. Controller 16 receives signals from each of the system sensors, quantifies the received information, and provides an output command signal(s) in response thereto, in this instance, for example, to the motor 46. Controller 16 is configured to develop the necessary voltage(s) out of inverter (not shown), which may optionally be incorporated with controller 16 and will be referred to herein as controller 16, such that, when applied to the motor 46, the desired torque or position is generated. Because these voltages are related to the position and speed of the motor 46 and the desired torque, the position and/or speed of the rotor and the torque applied by an operator are determined. A position encoder is connected to the steering shaft 51 to detect the angular position $\theta$. The encoder may sense the rotary position based on optical detection, magnetic field variations, or other methodologies. Typical position sensors include potentiometers, resolvers, synchros, encoders, and the like, as well as combinations comprising at least one of the forgoing. The position encoder outputs a position signal 20 indicating the angular position of the steering shaft 51 and thereby, that of the motor 46.

Desired torque may be determined by one or more torque sensors 28 transmitting torque signals 18 indicative of an applied torque. One or more exemplary embodiments include such a torque sensor 28 and the torque signal(s) 18 therefrom, as may be responsive to a compliant torsion bar, T-bar, spring, or similar apparatus (not shown) configured to provide a response indicative of the torque applied.

In one or more examples, a temperature sensor(s) 23 located at the electric machine 46. Preferably, the temperature sensor 23 is configured to directly measure the temperature of the sensing portion of the motor 46. The temperature sensor 23 transmits a temperature signal 25 to the controller 16 to facilitate the processing prescribed herein and compensation. Typical temperature sensors include thermocouples, thermistors, thermostats, and the like, as well as combinations comprising at least one of the foregoing sensors, which when appropriately placed provide a calibratable signal proportional to the particular temperature.

The position signal 20, velocity signal 21, and a torque signal(s) 18 among others, are applied to the controller 16. The controller 16 processes all input signals to generate values corresponding to each of the signals resulting in a rotor position value, a motor speed value, and a torque value being available for the processing in the algorithms as prescribed herein. Measurement signals, such as the above mentioned are also commonly linearized, compensated, and filtered as desired to enhance the characteristics or eliminate undesirable characteristics of the acquired signal. For example, the signals may be linearized to improve processing speed, or to address a large dynamic range of the signal. In addition, frequency or time based compensation and filtering may be employed to eliminate noise or avoid undesirable spectral characteristics.

In order to perform the prescribed functions and desired processing, as well as the computations therefore (e.g., the identification of motor parameters, control algorithm(s), and the like), controller 16 may include, but not be limited to, a processor(s), computer(s), DSP(s), memory, storage, register(s), timing, interrupt(s), communication interface(s), and input/output signal interfaces, and the like, as well as combinations comprising at least one of the foregoing. For example, controller 16 may include input signal processing and filtering to enable accurate sampling and conversion or acquisitions of such signals from communications interfaces. Additional features of controller 16 and certain processes therein are thoroughly discussed at a later point herein.

Figure 2:
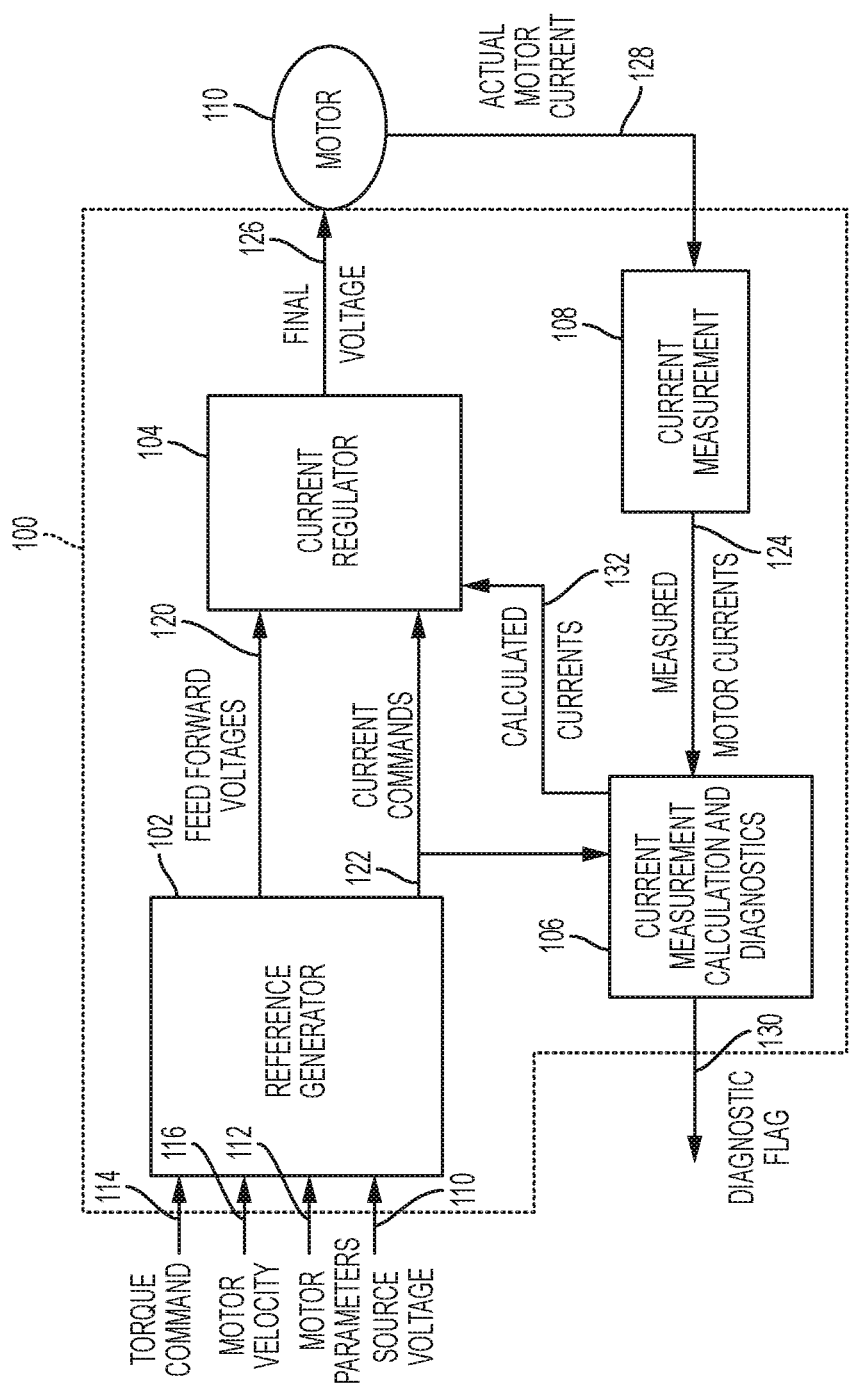
FIG. 2 depicts a block diagram of a torque control module 100 of a poly-phase permanent magnet synchronous machine (PMSM), utilizing phase current measurements in a current control feedback loop in accordance with some embodiments.

FIG. 2 depicts a block diagram of a torque control module 100 of a poly-phase permanent magnet synchronous machine (PMSM), utilizing phase current measurements in a current control feedback loop in accordance with some embodiments. As shown, the torque control module 100 includes a current generator 102 that generates a motor reference current command, a current regulator module 104, and a current measurement calculation and diagnostic module 106. FIG. 2 also depicts a motor 110, and a current measurement module 108 that measures feedback current from the motor 110.

As used herein, the term "module" or "sub-module" refers to an application specific integrated circuit (ASIC), an electronic circuit, a processor (shared, dedicated, or group) and memory that executes one or more software or firmware programs, a combinational logic circuit, and/or other suitable components that provide the described functionality. When implemented in software, a module or a sub-module can be embodied in memory as a non-transitory machine-readable storage medium readable by a processing circuit and storing instructions for execution by the processing circuit for performing a method. Moreover, the modules and sub-modules shown in the Figures may be combined and/or further partitioned.

The motor reference current generator 102 generates a feedforward voltage command 120 and a current command 122 based on input signals. The input signals may include a motor torque command 114, a motor velocity 116, a source voltage signal 118, and motor parameters 112. The motor torque command 114 represents a commanded torque value, and may be derived from another torque control module (not shown) such as an EPS, autonomous steering or semi-autonomous steering control unit, or may correspond to a torque value generated by an operator. The motor velocity 116 is an angular speed of the motor 110 measured by a speed sensor (not shown). The speed sensor may include, for example, an encoder and a speed calculation circuit for calculating the angular speed of a rotor of the motor 110 based on a signal received by the encoder. In some embodiments, the motor speed can be estimated from motor position. The source voltage signal 118 represents a bridge voltage from a DC power source (not shown).

The motor parameters 112 are estimated values for the motor 110, including, for example, a motor constant $K_e$ (Volt/rad/s), a motor circuit resistance R (Ohm), a direct axis inductance $L_d$ (Henry) and a quadrature axis inductance $L_q$ (Henry).

In some embodiments, the current command 122 generated by the motor reference current generator 102 includes a reference d-axis current command and a reference q-axis current command that are generated based on the motor torque command 114, the source voltage signal 118, and the angular speed. The motor reference current generator 102 also calculates the feedforward voltage command 120, which may include a feedforward d-axis voltage command and a feedforward q-axis voltage command. The current command 122 satisfies the motor torque command 114 and the source voltage signal 118.

The current regulator module 104 determines a final voltage command 126 based on the feedforward voltage command 120, the current command 122, and measured motor currents 124. The measured motor currents 124 include a measured d-axis current and a measured q-axis current, which are transformed from the current measurement signals in the stator reference frame.

The current regulator module 104 sends the final voltage command 126 to the motor 110 to control the motor 110. In some embodiments, a polar conversion controller (not shown) receives as inputs the d-axis voltage command and the q-axis voltage command. Based on the inputs, the polar conversion controller determines a voltage command and a phase advance angle. A pulse width modulation (PWM) generation module (not shown) then receives as input signals the voltage command and the phase advance angle from the polar conversion controller. The PWM generation module also receives a motor position or rotor angle value of the motor 110 measured by a motor position sensor (not shown), and generates multi-phase duty cycle values. In some embodiments, the PWM generation module may include an over-modulation space vector PWM unit that generates three respective duty cycle values. The duty cycle values are used to drive gate drive circuits of an inverter (not shown) that energize phases of the motor 110.

For feedback control purposes, the current measurement module 108 measures the actual motor currents 128 and sends values of measured motor currents 124 to the current measurement calculation and diagnostic module 106. In some embodiments, the current measurement module 108 includes current measurement sensors that generate the measured motor currents 124 from the actual currents 128 of the motor 110. The measured motor currents 124 therefore represent the values of phase currents (e.g. two phase, three phase) measured by the current measurement module 108.

Typically, in 3-phase current measurement systems, current sensor failures cause either transition to loss of assist mitigation mode or shutdown. For example, when a large offset error occurs in a phase current measurement, the closed loop current control operating in the synchronous reference frame adjusts the motor voltage so that the measurement of motor current matches the command, but since the measurement is incorrect, the actual motor currents are incorrect. The failure mode results in motor position dependent motor torque and current errors, which may be perceived as a large torque ripple at the motor shaft, and potentially larger than rated motor currents (for the hardware design). When the torque ripple caused by the phase current measurement offset error becomes large enough, it can produce motor torque in the opposite direction from the motor torque command. When used in an EPS system 12, failures which produce torque in a direction opposite to the desired motor torque command can result in violation of system safety goals or fault management requirements.

Because the sum of all three phase currents must always be equal to zero for a Y-connected or balanced motor, most motor control systems typically only employ two shunts in 3 phase inline current measurement systems. Due to varying system requirements, three shunt measurement systems may also be employed. In such systems, if an offset error occurs on only phase, it is possible to continue running the system in feedback control mode with the remaining two healthy measurements, and thereby, improving the fault tolerance and reliability of the overall drive system. This enables the motor control systems to continue operation in the feedback control mode (the desired control mode) when one shunt has failed, and also identification of multiple simultaneous failures which provided the ability to transition the system to feedforward control mode for loss of assist mitigation. Such current measurement fault detection algorithms work in feedback control mode.

However, in some motor control systems, such as in an EPS system 12, when a single point failure occurs, i.e., a single current measurement unit fails, the resulting braking torque may be too large for the operator (driver) to overcome if the system operates in feedback control, and hence the system is transitioned to the feedforward mode which employ state observer algorithms. For example, when the first single point failure occurs, the primary diagnostic checks for a failure condition, and control mode is changed to feedforward control. This enables system operation (in terms of steering feel for the driver, for instance, in an EPS system) with relatively good performance, especially when dynamic feedforward control is utilized. For three-phase current measurement systems, the diagnostic using the sum of the currents equal to zero logic is virtually instantaneous. However, the observer type algorithms required for specific shunt failure detection are typically slower and depend somewhat on the operating conditions. Thus, it may be desirable for such systems to detect the failure, transition to feedforward control mode, and then detect the specific shunt or multiple failures in feedforward control operation. The technical solutions described herein address such technical challenges by facilitating the detection of a single point failure as well as multiple simultaneous failures in a current measurement system. The technical solutions further facilitate virtually seamless fault tolerance in the case of current measurement system faults in motor control systems.

Figure 3:
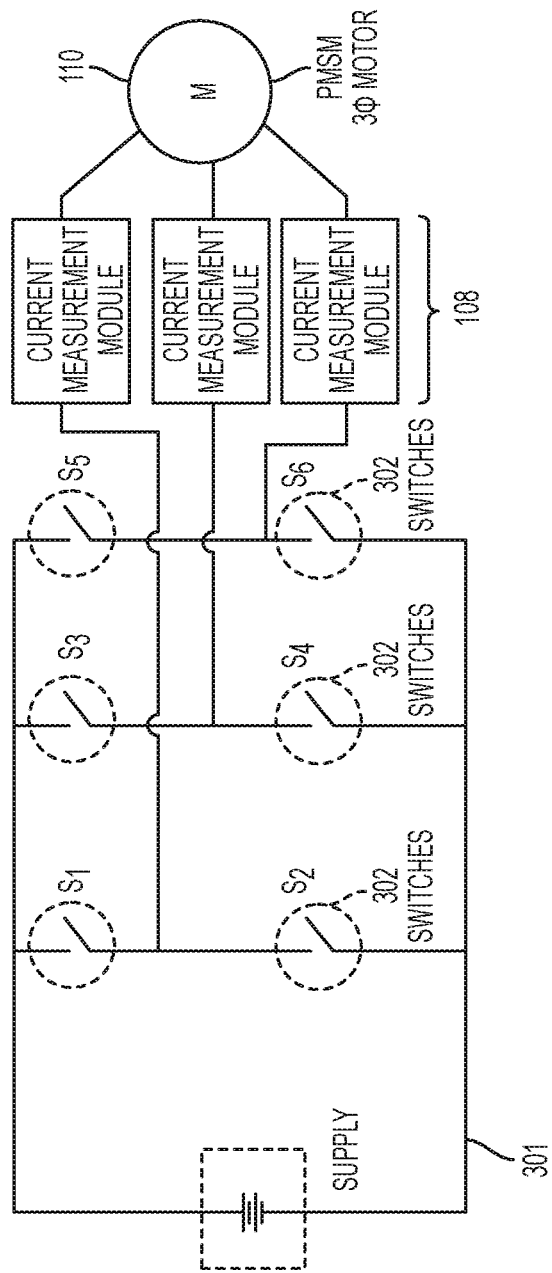
FIG. 3 shows example of inline current measurement for motor control systems according to one or more embodiments.

FIG. 3 shows example of inline current measurement for motor control systems according to one or more embodiments. The motor control system 100 includes an inverter module or a power supply 301, switches 302, current measurement modules 108, and a 3-phase motor 110. There are typically two ways to measure phase currents of the 3 phase motor 110—inline current measurement and low side current measurement. The technical solutions described herein are applicable to inline current measurement systems. In inline current measurement, the current measurement modules 108 directly measure the phase currents of the motor 110 as shown in FIG. 3. Note that for measuring the 3 phase currents of a Y-connected or balanced motor, two inline current measurements may be used and the third phase current may be calculated. In configurations with three inline current measurement systems, the technical solutions described herein facilitate detecting a current sensor fault in feedforward mode and also identify which sensor has failed. Based on the failed sensor identification, the motor control system 500 may be switched back to feedback control mode with two inline current measurement systems.

Figure 4:
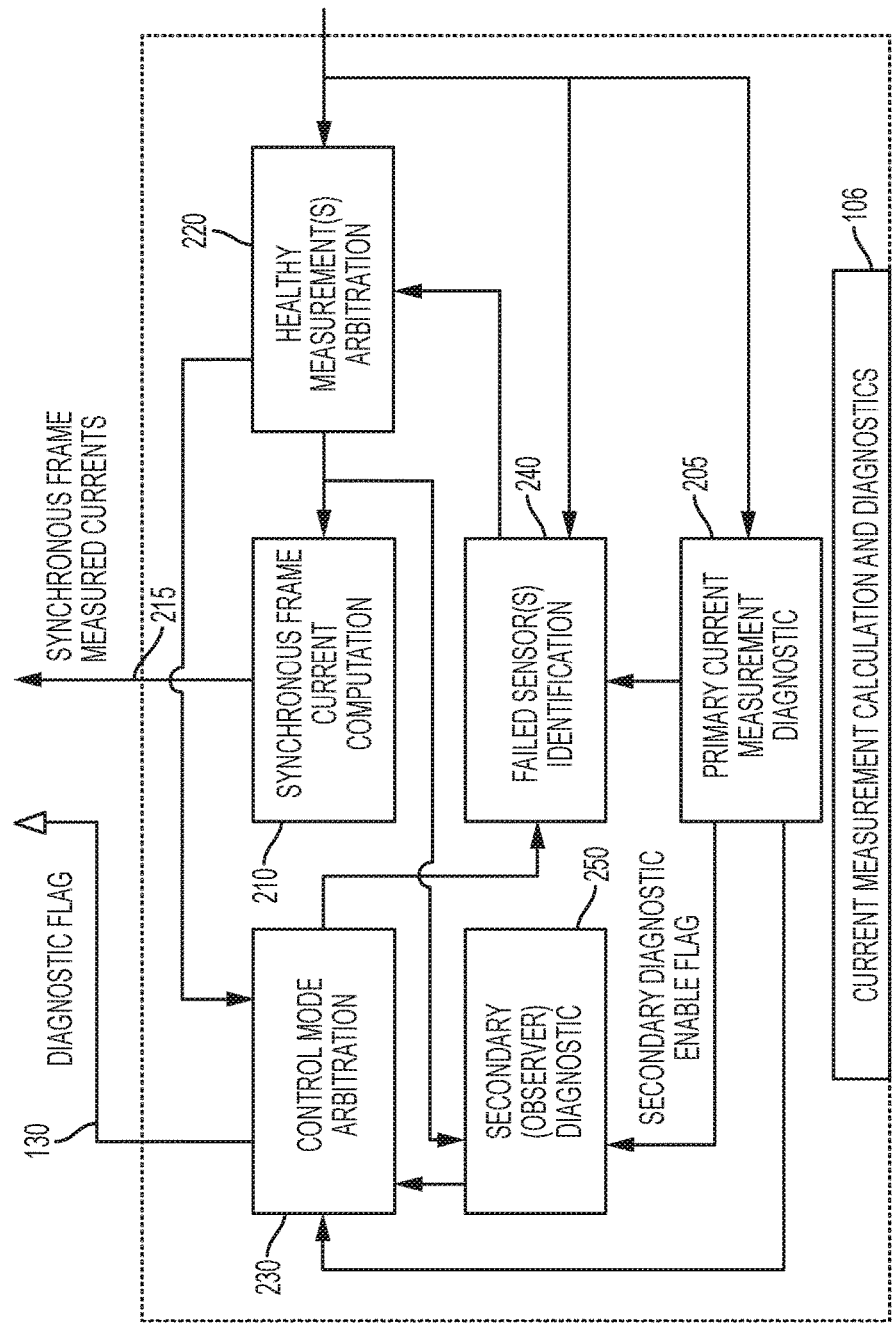
FIG. 4 depicts a block diagram of a current measurement calculation and diagnostics module according to one or more embodiments.

FIG. 4 depicts a block diagram of a current measurement diagnostic module according to one or more embodiments. During normal operation, the three measured currents are used by a synchronous frame current computation module 210 along with electrical motor position to obtain synchronous frame (d/q) currents, which are then used for current control via the current regulator 104. A primary current measurement diagnostic module 205 detects if a fault exists in the measured currents. For example, in some embodiments, the primary current measurement diagnostic module 205 could detect the fault based on the assumption that sum of the three phase currents is zero in a Y-connected or a balanced motor. When a first single point failure occurs, a control mode arbitration module 230 changes the current regulator 104 to operate in feedforward control mode.

In feedforward control operation, the failed sensor identification module 240 identifies the failed unit in the current measurement system. It should be noted that in feedforward control mode, current measurements are not used for control, rather an inverse machine model (static or dynamic) is used. Once the single point failure identification is complete, i.e., determination of the fact that a single failure has occurred, along with identification of the specific current measurement unit (sensor) that has failed, the motor control system is transitioned to feedback control mode (preferred control mode) via the current regulator 104 by the control mode arbitration module 230. During feedback operation, the healthy measurement arbitration module 220 utilizes the failed sensor information to send only healthy sensor data for computation of synchronous frame currents by the synchronous frame current computation module 210. At the same time, the secondary (observer type) diagnostic module 250 is enabled (and primary diagnostic module 205 is disabled) for detection of any subsequent failures. When such a subsequent failure occurs that the secondary diagnostic module 250 detects, and the motor control system 200 is permanently transitioned into feedforward control operation. In case the first failure itself is a multi-point failure, i.e., multiple sensors fail simultaneously, the failed sensor identification module 240 detects this, informs the healthy measurement arbitration module 220 and the control mode arbitration module 230 maintains the system in feedforward control mode permanently.

In one or more examples, the current measurement calculation and diagnostics module 106 identifies a specific failed sensor based on the magnitude and phase values, and outputs suitable notification flags to the control mode arbitration module 230, the secondary (observer) diagnostic module 250 or other suitable module configured to adjust or control how the measured motor current 124 is determined if a failed sensor is identified. Further, in one or more examples, the current measurement calculation and diagnostics module 106 provides a diagnostic flag 130 and the synchronous frame current measurements 132 to the current regulator module 104. Based on such inputs the current regulator 104 determines whether to use feedforward or feedback control to generate voltage commands to the motor.

It should be noted that although the example above describes the primary diagnostic module 205 using the sum of currents, in other examples, the primary diagnostic module 205 may use any other technique to detect a current offset error, for example, an observer model may be used.

The current measurement calculation and diagnostics module 106, specifically the failed sensor identification module 240, detects a specific sensor that has failed based on the magnitude $\Delta I_0$ and phase $\phi$ of the diagnostic current computed by the current measurement calculation and diagnostics magnitude module 106, as described further herein. The magnitude computation may be performed as follows, $$\Delta I_e = \frac{3}{2}\sqrt{\Delta I_\alpha^2 + \Delta I_\beta^2}$$

The phase evaluation may be performed as follows:

$$\phi = \tan^{-1}\left(\frac{\Delta I_\beta}{\Delta I_\alpha}\right)$$

As can be appreciated, in the diagnostic scheme of FIG. 2, the magnitude is first evaluated, and if it is larger than a calibratable threshold $\Delta I_{th}$, the phase is calculated (alternatively the phase could be calculated perpetually but used only when the magnitude exceeds a threshold). The magnitude may be compared to a second (e.g. critical) threshold $\Delta I_{thc}$ whose value is higher than $\Delta I_{th}$ to indicate whether multiple simultaneous sensor failures have occurred, in which case the diagnostic scheme could send out a shutdown (or loss of assist mitigation) flag. However, a large enough resistance estimation error may also cause $\Delta I_e$ to become either lower than $\Delta I_{th}$ or higher than $\Delta I_{thc}$, resulting in no detection or false detection respectively. This may be overcome by making the thresholds $\Delta I_{th}$ and $\Delta I_{th}$, dynamic values that change with an indicator that indicates the "amount" of parameter error. Such an indicator may be obtained, for instance, from the $\Delta I_{dq}$ values after filtering with a programmable low-pass filter, since any average content implies presence of an offset error. Note that such large estimation errors do not typically occur in properly tuned systems, and therefore a detailed discussion of this scheme is not included here.

It is noted that a number of values related to the current differences discussed above may be used as the diagnostic current. The diagnostic current may be calculated as or based on a difference between currents. For example, the diagnostic current can be $\Delta I_0$, $\Delta I_e$, or $\sqrt{\Delta I_\alpha^2 + \Delta I_\beta^2}$.

The value of the phase may be equal to one of 0, $-\phi_x$ or $\phi_x$, depending on whether the offset error is in phase a, b or c respectively. However, for improved robustness (required due to bandwidth limitations of current regulators), a detection window of $\phi_w$ is built around the nominal phase values for each of the errors, and the calculated phase is checked to see if it lies within the detection window of a specific shunt. If the value is not within any of the windows, it implies multiple simultaneous failures, and the diagnostic scheme sends out a shutdown (or loss of assist mitigation) flag.

The phase calculations may be summarized as follows:

$$F_s = \begin{cases} a, & -\phi_w \leq \phi \leq \phi_w \\ b, & -\phi_x - \phi_w \leq \phi \leq -\phi_x + \phi_w \\ c, & \phi_x - \phi_w \leq \phi \leq \phi_x + \phi_w \\ m, & \text{else} \end{cases}$$

$F_s$ represents the sensor that has failed and m implies multiple simultaneous sensor failures. Note that the phase detection mechanism may be configured for negative electromechanical polarity systems by simply exchanging the logic for phases b and c.

The error phase is evaluated once the magnitude exceeds the threshold to determine which sensor has failed, and identification and other information regarding the specific sensor(s) that have failed may be sent to current calculation transition module 314 via a failed sensor information signal. Once the failed sensor has been detected, the current measurement is modified by the current mode arbitration module 230 to use the remaining healthy sensors, and the system is able to operate in feedback control mode. Note that once the system starts operating in feedback mode after the first single point failure by the primary diagnostics, along with the failed sensor identification module and the secondary diagnostic is activated, a subsequent current measurement failure would result in the diagnostic flag being permanently latched to operate the system in feedforward current control mode. Alternatively, the system could simply be shutdown, instead of operating in feedforward control mode. Feedforward control operation may be initialized by providing the diagnostic flag 130 directly to the current controller and/or reference generation module such that the final voltages are computed appropriately.

Figure 5:
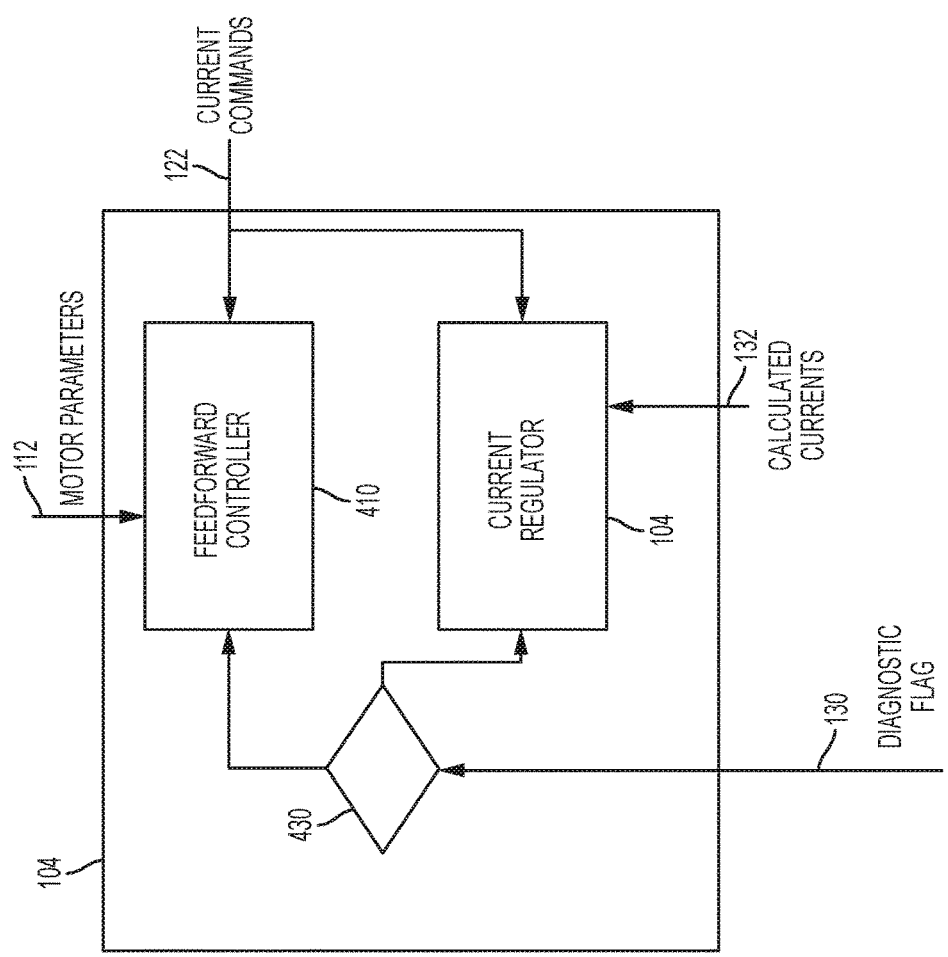
FIG. 5 depicts an example block diagram of a current controller that selects between feedback and feedforward operating mode according to one or more embodiments.
Figure 6:
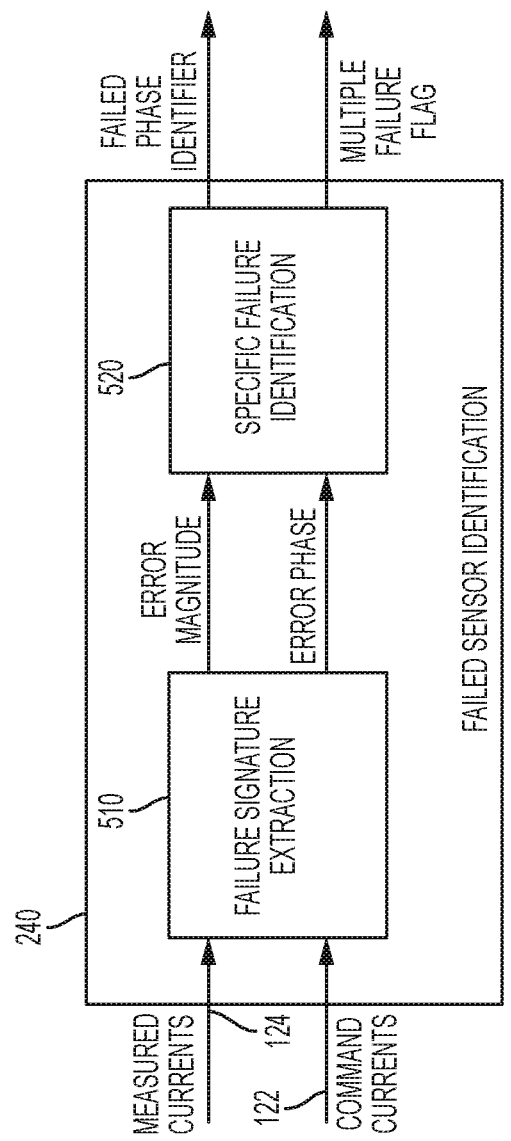
FIG. 6 depicts a block diagram of failed sensor identification module according to one or more embodiments.

FIG. 5 depicts an example block diagram for selection of operation mode of the motor control system according to one or more embodiments. The control selector 430 receives the diagnostic flag 130 from the current measurement calculation and diagnostic module 106. Based on the diagnostic flag, the control selector 430 selects using either the feedforward controller 410 for feedforward mode operation of the motor control system or the current regulator 104 for feedback mode operation of the motor control system. As described herein, after a first single point failure, the control selector 430 selects the feedforward controller 410 until the failed component is identified, and then switches back to the feedback mode in case of single point failure. The current regulator 104 continues to operate using feedback mode based on the healthy components at this time. In case of a further component failure, the control selector 430 switches permanently to the feedforward control 410. Alternatively, or in addition, in case of further failures, the motor control system 200 may be shutdown, in one or more examples. FIG. 6 depicts a block diagram of failed sensor identification module according to one or more embodiments. The failed sensor identification module 240 module includes a failure signature extraction module 510 and a specific failure identification 520, among other components. The failed sensor identification module 240 determines Current Measurement Offset Errors. The current measurements with offset errors in the three-phase abc stationary reference frame may be mathematically expressed as, $$I_{am} = I_a + \Delta I_a$$
$$I_{bm} = I_b + \Delta I_b$$
$$I_{cm} = I_c + \Delta I_c$$

The transformation to the two-phase αβ stationary frame gives, $$I_{\alpha m} = I_\alpha + \Delta I_\alpha$$
$$I_{\beta m} = I_\beta + \Delta I_\beta$$

where $$\Delta I_\alpha = \frac{2\Delta I_a - \Delta I_b - \Delta I_c}{3}$$

and $$\Delta I_\beta = \pm \frac{\Delta I_b - \Delta I_c}{\sqrt{3}}.$$

The + and − signs in the $\Delta I_\beta$ term signs are for positive and negative electromechanical polarity systems respectively. It is important to note this sign difference, since it is essential for configuring the detection algorithm for the two system configurations. The rest of the description herein is provided for a positive electromechanical polarity system, however, it should be obvious how the same scheme shall work for negative systems. The transformation matrix for converting between the abc and αβ stationary frames is, $$\begin{bmatrix} \alpha \\ \beta \\ 0 \end{bmatrix} = \frac{2}{3} \begin{bmatrix} \cos 0 & \cos\left(\frac{2\pi}{3}\right) & \cos\left(-\frac{2\pi}{3}\right) \\ \sin 0 & \sin\left(\frac{2\pi}{3}\right) & \sin\left(-\frac{2\pi}{3}\right) \\ \frac{1}{2} & \frac{1}{2} & \frac{1}{2} \end{bmatrix} \begin{bmatrix} a \\ b \\ c \end{bmatrix}.$$

When transformed into the synchronous reference frame, the measured dq currents become $$I_{dm} = I_d + \Delta I_d = I_d + \Delta I_0 \cos(\theta - \phi)$$

$$I_{qm} = I_q + \Delta I_q = I_q + \Delta I_0 \sin(\theta - \phi)$$

where the magnitude and phase of the errors terms are:

$$\Delta I_0 = \sqrt{\Delta I_\alpha^2 + \Delta I_\beta^2}$$

$$= \frac{2}{3}\sqrt{\Delta I_a^2 + \Delta I_b^2 + \Delta I_c^2 - \Delta I_a \Delta I_b - \Delta I_b \Delta I_c - \Delta I_c \Delta I_a}$$

$$\phi = \tan^{-1}\left(\frac{\Delta I_\beta}{\Delta I_\alpha}\right)$$

$$= \tan^{-1}\left(\sqrt{3}\,\frac{\Delta I_b - \Delta I_c}{2\Delta I_a - \Delta I_b - \Delta I_c}\right)$$

Note that the transformation matrices are, $$\begin{bmatrix} d \\ q \end{bmatrix} = \begin{bmatrix} \cos\theta & \sin\theta \\ \sin\theta & -\cos\theta \end{bmatrix} \begin{bmatrix} \alpha \\ \beta \end{bmatrix}$$

$$\begin{bmatrix} \alpha \\ \beta \end{bmatrix} = \begin{bmatrix} \cos\theta & \sin\theta \\ \sin\theta & -\cos\theta \end{bmatrix} \begin{bmatrix} d \\ q \end{bmatrix}$$

From the error equations, it is seen that if there is an offset error on only one phase at a time, say $\Delta I_e$, the magnitude of the error is $$\Delta I_0 = \frac{2}{3}\Delta I_e$$

The error is the same irrespective of the specific shunt. The phase of the error term carries the information of the specific shunt that has failed, and the value is unique for each shunt. The values of the phase for error in the three phases respectively are, $\phi_a = 0$ $\phi_b = \tan^{-1}(-\sqrt{3}) = -\phi_x$ $\phi_c = \tan^{-1}(\sqrt{3}) = -\phi_x$ Because positive and negative errors in any shunt produce the same phase value, the signature of the offset error in the phase value is unique for each shunt, irrespective of the sign of the error.

The failure signature extraction module 510 determines the signature in the feedforward mode (switched after the failure is detected). Therefore, for the signature extraction, the module 510 uses measure currents 124 directly. In feedforward control operation, the voltage commands are computed using the inverse machine model as specified below.

$$V_d = \tilde{L}_d \dot{I}_{dr} + \tilde{R} I_{dr} + \omega_e \tilde{L}_q I_{qr}$$

$$V_q = \tilde{L}_q \dot{I}_{qr} + \tilde{R} I_{qr} - \omega_e \tilde{L}_d I_{dr} + \tilde{K}_e \omega_m$$

where $I_{dqr}$ are commanded or reference currents, $\omega_m$ and $\omega_e$ are the motor mechanical and electrical velocity respectively related via the machine poles $N_p$ by $$\omega_e = \frac{N_p}{2}\omega_m,$$

and $\tilde{R}$, $\tilde{L}_d$, $\tilde{L}_q$ and $\tilde{K}_e$ are the estimated machine resistance, d and q axis inductance and voltage constant respectively.

Assuming machine parameter estimates are accurate, the actual phase currents may be assumed to be equal to commanded currents 122, i.e., $I_{dqr} = I_{dq}$. Since the measured currents are inaccurate, the current difference $\Delta I_{dq}$ may be computed (other techniques, described later, may be used instead as well) as shown below.

$$\Delta I_{dq} = I_{dqm} - I_{dq}$$

$$= I_{dqm} - I_{dqr}$$

It should be noted that the current errors are related to $\Delta I_0$ and $\phi$ as mentioned above, which are used to extract the failure signature information. The values of $\Delta I_0$ and $\phi$ are obtained by first performing a demodulation operation. One way of performing the demodulation is to apply the inverse Park transformation and obtaining current differences $\Delta I'_{\alpha\beta}$ in the diagnostic stationary reference frame. For example:

$$\Delta I'_\alpha = \Delta I_d \cos(\theta) + \Delta I_q \sin(\theta)$$

$$= \Delta I_0 \cos(\theta - \phi)\cos(\theta) + \Delta I_0 \sin(\theta - \phi)\sin(\theta)$$

$$= \Delta I_0 \cos(\phi)$$

$$\Delta I'_\beta = \Delta I_d \sin(\theta) - \Delta I_q \cos(\theta)$$

$$= \Delta I_0 \cos(\theta - \phi)\sin(\theta) - \Delta I_0 \sin(\theta - \phi)\cos(\theta)$$

$$= \Delta I_0 \sin(\phi)$$

In case the machine parameter estimates are not accurate, the actual currents 128 are not equal to reference currents 122. The relationship between the actual 128 and commanded current 122 under the presence of different parameter errors may be expressed as shown below.

$$\begin{bmatrix} I_d \\ I_q \end{bmatrix} = \frac{1}{R^2 + \omega_e^2 L_d L_q}\begin{bmatrix} \omega_e^2 L_q \tilde{L}_q + R\tilde{R} & -\omega_e(R\tilde{L}_q - L_q \tilde{R}) \\ \omega_e(R\tilde{L}_d - L_d \tilde{R}) & \omega_e^2 L_d \tilde{L}_d + R\tilde{R} \end{bmatrix}\begin{bmatrix} I_{dr} \\ I_{qr} \end{bmatrix} +$$

$$\frac{\omega_m(K_e - \tilde{K}_e)}{R^2 + \omega_e^2 L_d L_q}\begin{bmatrix} -\omega_e L_q \\ R \end{bmatrix}$$

where R, $L_d$, $L_q$ and $K_e$ are the actual machine resistance, d and q axis inductance and voltage constant respectively. Thus, the current errors may be computed as shown below.

$$\begin{bmatrix} I_{dr} - I_d \\ I_{qr} - I_q \end{bmatrix} =$$

$$\frac{1}{R^2 + \omega_e^2 L_d L_q} \begin{bmatrix} \omega_e^2 L_q (L_d - \tilde{L}_d) + R(R - \tilde{R}) & -\omega_e(R\tilde{L}_q - L_q\tilde{R}) \\ \omega_e(R\tilde{L}_d - L_d\tilde{R}) & \omega_e^2 L_d(L_q - \tilde{L}_q) + R(R - \tilde{R}) \end{bmatrix}$$

$$\begin{bmatrix} I_{dr} \\ I_{qr} \end{bmatrix} + \frac{\omega_m(K_e - \tilde{K}_e)}{R^2 + \omega_e^2 L_d L_q} \begin{bmatrix} -\omega_e L_q \\ R \end{bmatrix}$$

Due to this imperfect current tracking, the synchronous frame current difference $\Delta I_{dq}$ has an additional DC error term which may be obtained from the calculations shown above. This discrepancy may be expressed mathematically as below.

$$\Delta I_d = \Delta I_0 \cos(\theta + \phi) + \Delta I_{de}$$

$$\Delta I_q = \Delta I_0 \sin(\theta + \phi) + \Delta I_{qe}$$

If the Park transform is applied on these signals, the resulting diagnostic stationary frame current difference signals contain undesirable sinusoidal terms as follows.

$$\Delta I'_\alpha = \Delta I_0 \cos(\phi) + (\Delta I_{de}\cos(\theta) + \Delta I_{qe}\sin(\theta))$$

$$\Delta I'_\beta = \Delta I_0 \sin(\phi) + (\Delta I_{de}\sin(\theta) - \Delta I_{qe}\cos(\theta))$$

Technical solutions described herein address the technical challenges of such undesirable sinusoidal terms in several ways to reduce the impact of parameter estimation errors, including the use of adaptive bandpass filters in the synchronous frame before demodulation, or adaptive low-pass filters in the diagnostic stationary frame after demodulation. Such techniques are described further.

FIG. 6 illustrates block diagrams of reducing the effects of parameter errors before extracting current sensor offset error failure signature according to one or more embodiments. FIG. 6 depicts different examples implementations, a first failure signature extraction module 510A, a second failure signature extraction module 510B, and a third failure signature extraction module 510C. In the failure signature extraction modules 510A-B use synchronous frame signals from the measured current 124 and the current commands 122 as input.

The first failure signature extraction module 510A includes a difference calculation module 610 for calculating a current difference 610 between the measured current 124 and current commands 122 as described earlier. Further, the first failure signature extraction module 510A includes a programmable band-pass filter module 620, and a transformation module 630.

The programmable band-pass filter module 620 may include a cascaded high-pass and low-pass (gain and phase compensation module) filter structure including a programmable high-pass filter module and low-pass filter module. The band-pass filter module 620 receives the current difference 612 between the current command 122 and feedforward measured current 124. The programmable high-pass filter module results in a removal of constant components from the current difference 612. Accordingly, the programmable high-pass filter module may have a cutoff frequency that proportional to a synchronous frequency $\omega_e$ of the motor 110 (FIG. 1). The programmable high pass filter module may be programmed based on a calibratable constant value. The calibratable constant value may be tuned to reduce gain and phase error in the sinusoidal current component. A transfer function of the programmable high pass filter module may be written as follows:

$$H(s) = \frac{s}{s + k\omega_e}$$

where k is the calibratable constant, which may be tuned to reduce gain and phase error in the sinusoidal component. The programmable high-pass filter module may utilize the synchronous frequency $\omega_e$ and the gain and phase error introduced by the filter is static. Also, with the programmable high pass filter module, the calibratable constant k may be independently tuned to ensure minimal distortion of the input signal. The programmable high-pass filter module is not limited to the above embodiment. For instance, a higher order filter may be used, so long as the programmable filter removes the constant component of the current difference 612.

The high-pass filter module produces a high-pass filtered current difference that is sent to the programmable low-pass filter module. The programmable high-pass filter module may introduce magnitude and phase errors to the filtered current difference 622, which require a compensation to be performed by the low-pass filter module (also referred to here as a gain and phase compensation module). In some embodiments, the gain and phase compensation module includes a first-order unity gain programmable low-pass filter (PLPF) with the following transfer function:

$$L(s) = \frac{k'\omega_e}{s + k'\omega_e}$$

The first-order unity gain programmable low-pass filter may compensate filtered current difference 622 to restore the gain and phase of the final current command 122. The compensation may be performed according to constraint equations written as:

$$\angle H(j\omega_e) - \angle L(j\omega_e) = 0$$

$$|H(j\omega_e)L(j\omega_e)| = 1$$

In other embodiments, the gain and phase compensation module may utilize a second order low-pass filter with a transfer function shown below.

$$L(s) = \frac{k'^2 \omega_e^2}{s^2 + 2\zeta k'\omega_e s + k'^2\omega_e^2}$$

The second order low-pass filter shown above may allow for more specific transient responses by using two tuning parameters k' and $\zeta$. The gain and phase compensation may require different k' and respectively to achieve the steady state specifications, which must be calculated appropriately with the method presented above.

With the cascaded filter structure mentioned above, the programmable band-pass filter module 620 has a transfer function of the form, $$B(s) = H(s)L(s),$$

where:

$$\angle H(j\omega_e) - \angle L(j\omega_e) = 0$$

$$|H(j\omega_e)L(j\omega_e)| = 1$$

The programmable band-pass filter module 620 generates a filtered compensated current difference 622 that is sent to a transformation module 630 for processing. In one or more examples, the transformation module 630 utilizes an inverse Park transformation or a similar mathematical transformation to convert the measured phase currents in the DC frame (rotor reference frame, or d/q reference frame) to the AC frame (stator reference frame), simplifying the analysis of the error determination. The output of the transformation module 630, a filtered current difference in the stationary (stator) frame 632, is sent to the error identification module 520. In one or more examples, a magnitude of the diagnostic current is compared to a threshold value, for example, in a stator reference frame, and determines whether a current measurement offset error is present, e.g., if the magnitude exceeds the threshold.

The programmable band-pass filter module 620 may be digitally implemented to mitigate a difference in magnitude and phase of a continuous time filter. The digital implementation of the filter module 620 may be based on the synchronous frequency but implemented in a discrete domain, as shown in the following equation, where $\omega_e$ is a synchronous frequency of the motor 110, for example of a power steering system 12, or any other application such as a power tool. Further, the $T_s$ is a sampling time of the control loop in which the filter module 620 is implemented, $$s = \frac{\omega_e}{\tan\left(\frac{\omega_e T_s}{2}\right)} \frac{1 - z^{-1}}{1 + z^{-1}}$$

Although in the foregoing example, the band-pass filter module 620 includes a programmable high-pass and a low-pass filter module, it is further contemplated and understood that the filter may be a direct band-pass filter, with imaginary poles. Alternatively, or in addition, the filter module 620 may be of higher order, a fourth or fifth order filter for example. Further, in one or more examples, instead of processing the current difference 612, the difference calculation module 610 may be eliminated and the final current command 122 may be used directly as an input to the band-pass filter module 620 instead of the current difference 612.

Referring now to the second failure signature extraction module 510B, the second module 510B also includes the difference calculation module 610 for calculating a current difference 610 between the measured current 124 and current commands 122 as described earlier, and the transformation module 630 for performing inverse Park transformation or the like. In the second failure signature extraction module 510B the current difference 612 is demodulated prior to filtering to generate a current difference in the stationary (stator) frame 634, as shown in FIG. 6. The current difference in the stationary (stator) frame 634 is provided to a programmable low-pass filter 640. The low pass filter 640 is a PLPF as described earlier with the transfer function L(s) to restore the gain and phase of the final current command 122. The low-pass filter 640 may be a first order, second order, or any higher order filter. The low-pass filter 640 generates the filtered current difference in the stationary frame 632 for further use as described herein.

As described herein, and illustrated in FIG. 6, the first and second failure signature extraction modules 510A-B use current difference and command current in the synchronous frame as inputs. In yet another example, the third failure signature extraction module 510C, instead of an indirect technique of using synchronous frame currents and then performing the demodulation, uses the stationary frame measured currents may directly by assuming that the commanded currents $I_{\alpha\beta r}$ 122 in the stationary frame (transformed from synchronous frame current commands) are equal to actual currents 128 as follows.

$$\Delta I'_{\alpha\beta} = I_{\alpha\beta m} - I_{\alpha\beta}$$

$$= I_{\alpha\beta m} - I_{\alpha\beta r}$$

where commanded currents $I_{\alpha\beta r}$ in the stationary frame are obtained as follows.

$$\begin{bmatrix} I_{\alpha r} \\ I_{\beta r} \end{bmatrix} = \begin{bmatrix} \cos\theta & \sin\theta \\ \sin\theta & -\cos\theta \end{bmatrix} \begin{bmatrix} I_{dr} \\ I_{qr} \end{bmatrix}$$

The third failure signature extraction module 510C thus includes a difference calculation module 610' that computes the current difference 612' in the stationary frame as described above using stationary frame measured current 124' and stationary frame current command 122'.

Due to this imperfect current tracking resulting from parameter estimation errors, the stationary frame current difference $\Delta I'_{\alpha\beta}$ has an additional sinusoidal error term, which may be obtained from the calculations shown above. This discrepancy may be expressed mathematically as below.

$$\Delta I'_\alpha = \Delta I_\alpha + \Delta I_{\alpha e}$$

$$\Delta I'_\beta = \Delta I_\beta + \Delta I_{\beta e}$$

Thus, filtering techniques mentioned above may be used to reduce the parameter estimation error impact in this case as well. The third failure signature extraction module 510C includes a programmable low-pass filter 640' that filters the current difference in the stationary frame 612' to generate the filtered current difference in the stationary frame 632 without demodulation.

In one or more examples, the filtered current difference in the stationary frame 632 is received by a magnitude calculation and phase extraction module 650. The module 650 determines a magnitude and phase of the received input. The determined magnitude and phase, together, are used as a signature to identify the failure, i.e. if the failure is a single point failure or a multi-point failure, and if a single point failure, which component has failed, as described earlier herein.

Figure 7:
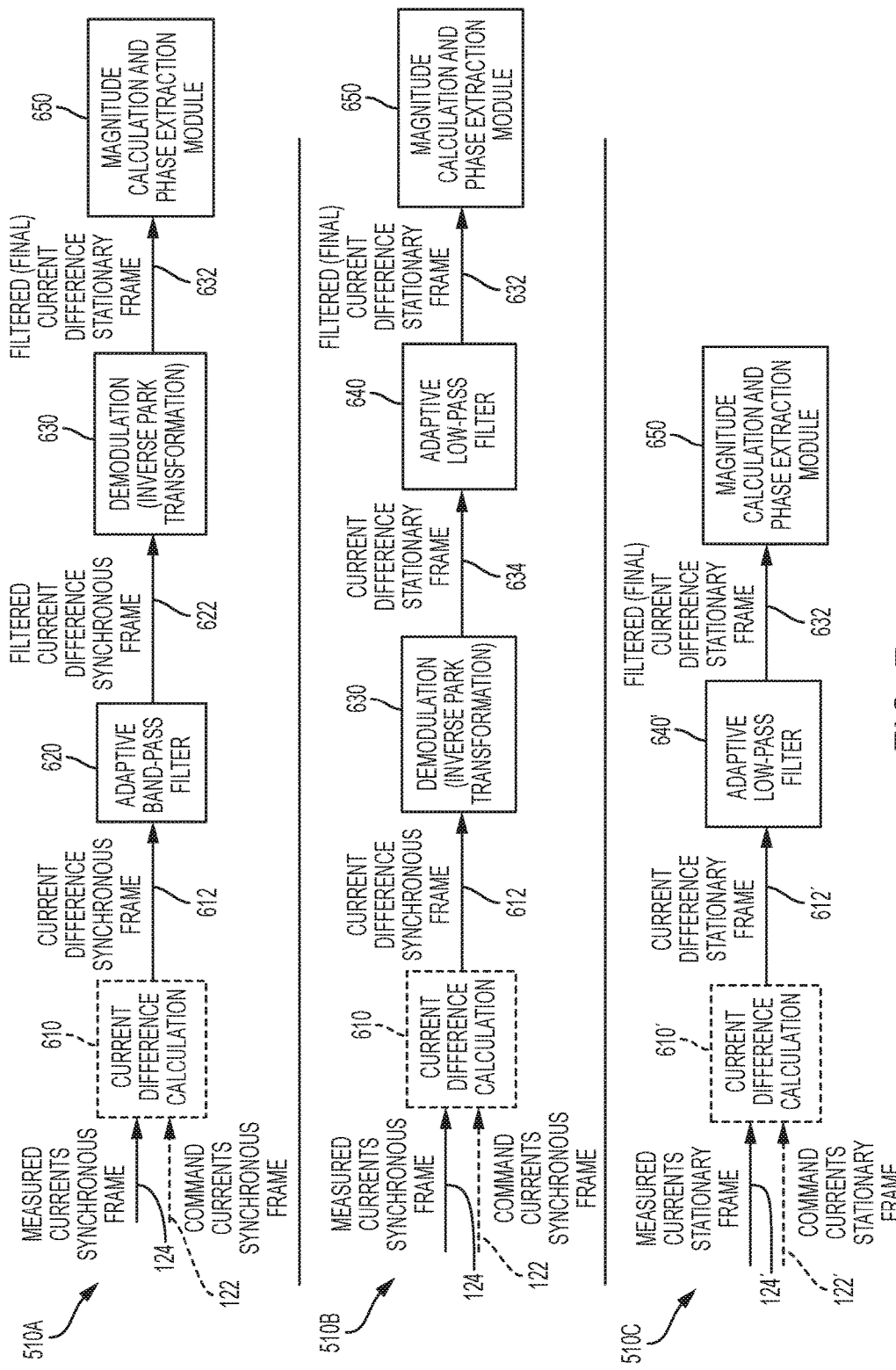
FIG. 7 illustrates block diagrams of implementing a failure signature extraction module according to one or more embodiments.

It should be noted that in one or more examples, the measured currents in synchronous frame 124 may be used directly (without difference calculation). The modules for adaptive band pass filter 620, the demodulation 630, and adaptive low pass filter 640' receive the measured currents and synchronous frame 124 for further processing as described herein. (FIG. 7 accordingly depicts the current difference calculation modules and input command currents using dashed lines). The difference calculation removes low frequency components (due to varying operating conditions) before the transformation of the currents into stationary frame.

The failure signature extraction modules described herein provide diagnostic robustness for high synchronous frequencies, as well as a full spectrum of synchronous frequencies. Any one of these failure signature extraction modules is used in the failed sensor identification module 240. The different implementations exhibit different accuracies in different range of inputs, and accordingly the failure signature extraction module is selected depending on the application for which the motor control system 200 is being used.

Referring back to FIG. 6, the output of the failure signature extraction module is forwarded to the specific failure identification module 520. The specific failure identification module 520 identifies the specific failed current measurement component using the input values of the extracted phase and extracted magnitude.

Figure 8:
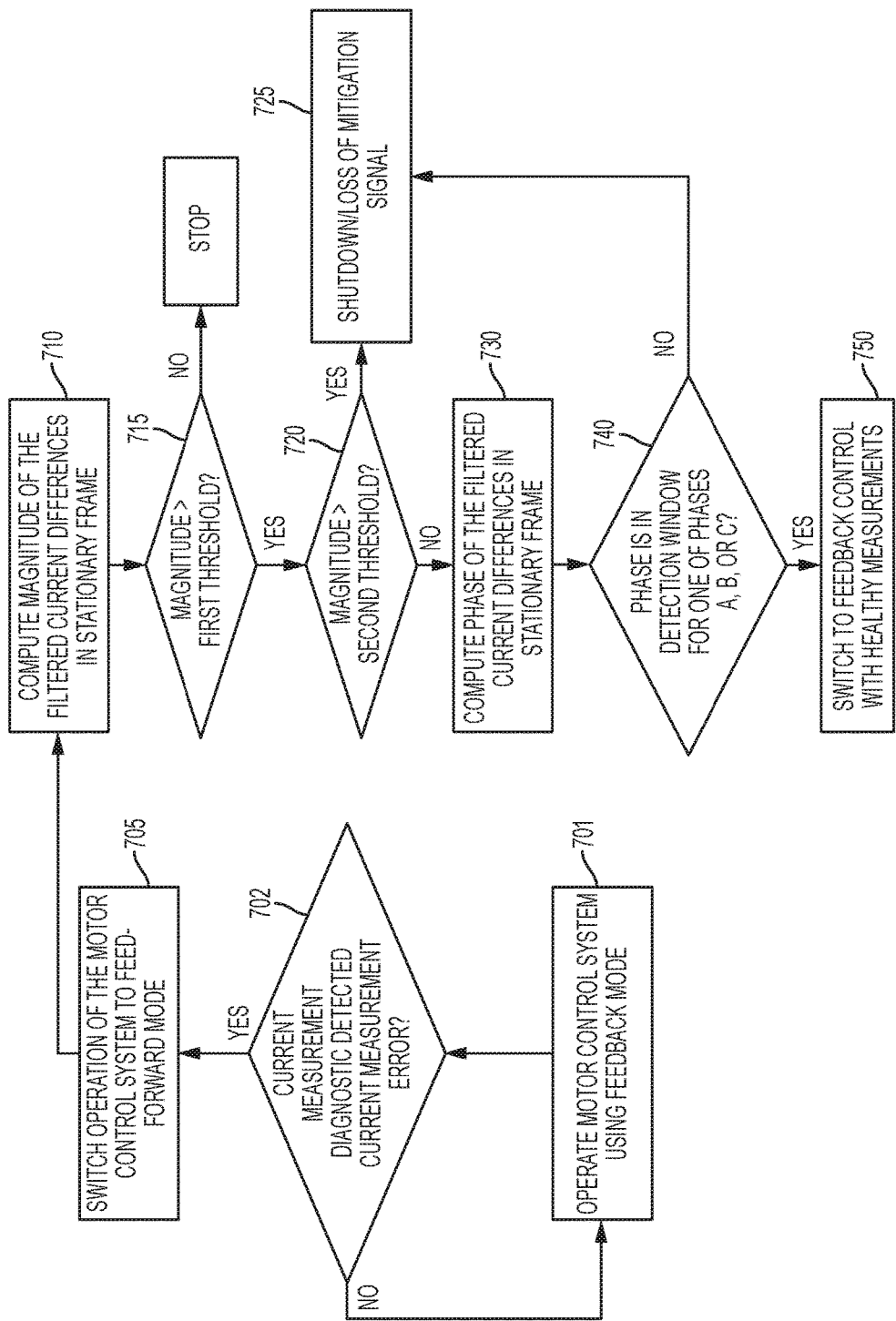
FIG. 8 illustrates a flowchart of an example method for identifying the specific failed current measurement component in feedforward control operating mode according to one or more embodiments.

FIG. 8 illustrates a flowchart of an example method for identifying the specific failed current measurement component in feedforward control operating mode according to one or more embodiments. The method includes operating the motor control system 200 using the feedback mode, as shown at 701. The operation of the motor control system 200 continues until the current measurement calculation and diagnostic module 106 detects a current measurement error, as shown at 702. The current measurement error is detected based on the measured current values 124 and estimated current values based on the current commands 122 by the primary diagnostic module 205. If a current measurement error is detected, the motor control system 200 is switched to the feedforward operating mode, as shown at 705. The primary diagnostic module 205 may detect a current offset error in the current measurement based on a sum of current measurements in multiple phases not being equal to a predetermined value, such as zero. Alternatively, or in addition, the primary diagnostic module 205 detects the current offset error using an observer, or any other technique. The method further includes determining the failed component that caused the current measurement error when operating in the feedforward mode, using the secondary diagnostic module 250, as described herein.

The specific failure identification module 520 determines the value of magnitude ($\Delta I_0$) of the final current differences 632 in the diagnostic stationary frame $\Delta I'_{\alpha\beta}$ as shown at 710. For example, the computation can be expressed as:

$$\Delta I_0 = \sqrt{\Delta I'_\alpha{}^2 + \Delta I'_\beta{}^2}$$

In one or more examples, the current difference magnitude is evaluated by comparing with a calibratable threshold $\Delta I_{th}$, as shown at 715. If the magnitude is larger than the threshold, the magnitude is compared to a second "critical" threshold $\Delta I_{thc}$ whose value is higher than $\Delta I_{th}$ to indicate whether multiple simultaneous sensor failures have occurred, in which case the diagnostic scheme sends out a shutdown (or loss of assist mitigation) flag, as shown at 720 and 725.

If the magnitude is larger than the first threshold, but smaller than the second threshold, a single point failure has occurred, and a phase ($\phi$) of the filtered current difference in the stationary frame 632 is calculated, as shown at 730. For example:

$$\phi = \tan^{-1}\left(\frac{\Delta I'_\beta}{\Delta I'_\alpha}\right)$$

The value of the current difference phase will ideally, as mentioned earlier, be either 0, $-\phi_x$, or $\phi_x$, depending on whether the offset error is in phase a, b or c respectively. However, for improved robustness, a small detection window of $\phi_w$ is built around the nominal phase values for each of the errors, and the calculated phase is checked to see if it lies within the detection window of a specific shunt, as shown at 740. The phase calculations may be expressed as follows for each of the phase:

$$F_s = \begin{cases} a, & -\phi_w \leq \phi \leq \phi_w \\ b, & -\phi_x - \phi_w \leq \phi \leq -\phi_x + \phi_w \\ c, & \phi_x - \phi_w \leq \phi \leq \phi_x + \phi_w \\ m, & \text{else} \end{cases}$$

where $F_s$ represents the sensor that has failed and m represents multiple simultaneous sensor failures.

In one or more examples, the phase detection mechanism may be configured for negative electromechanical polarity systems by exchanging the logic for phases b and c. In the above, if the phase of the current difference lies in any one of the detection windows, the sensor associated with the particular phase (a, b, or c) is identified as the component that failed. Thus, the detection of the failure and/or the failed sensor happens in feedforward mode. Upon detection, the motor control system 200 is switched back to feedback mode to operate using the available healthy current measurements, as shown at 750. If the value is not within any of the windows, it implies multiple simultaneous failures, and the diagnostic scheme sends out a shutdown (or loss of assist mitigation) flag, as shown at 725.

Thus, a detection window value is computed from the nominal phase values, and a first sensor failure is determined by the phase value falling between a negative detection window value and a positive detection window value. Further, a second sensor failure is determined by the phase value falling between the detection window value being subtracted from a non-zero phase error value ($\phi_x$) and the detection window being added to the non-zero phase error value.

Figure 9:
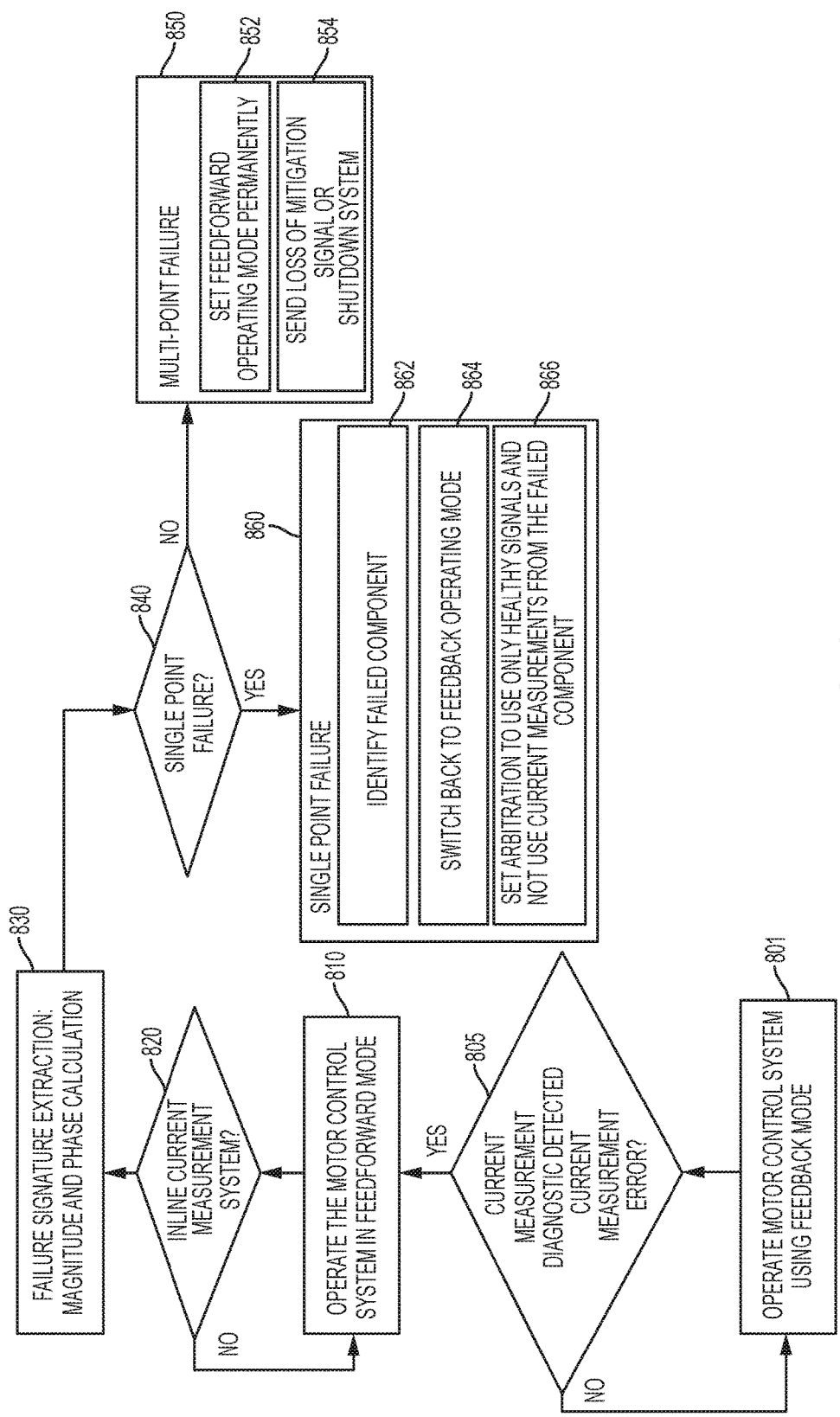
FIG. 9 illustrates a flowchart of an example method for a fault tolerant current measurement in motor control system according to one or more embodiments.

FIG. 9 illustrates a flowchart of an example method for a fault tolerant current measurement in motor control system according to one or more embodiments. The method includes operating the motor control system 200 using the feedback mode, as shown at 801. The operation of the motor control system 200 continues until the current measurement calculation and diagnostic module 106 detects a current measurement error, as shown at 805. The current measurement error is detected based on the measured current values 124 and estimated current values based on the current commands 122. If a current measurement error is detected, the motor control system 200 is switched to the feedforward operating mode, as shown at 810. For example, the current measurement calculation and diagnostic module 106 indicates the switch using the diagnostic flag 130 to the current regulator 104 to make the switch in the operating modes.

The method further includes determining if the motor control system 200 uses inline current measurement for measuring the actual motor currents 128, as shown at 820. In one or more examples, a flag is setup in the controller 26 to indicate if an inline current measurement is being used. If inline current measurement is not being used, the motor control system 200 continues to operate in feedforward mode, as shown at 810. If an inline measurement is being used, the method includes extracting a failure signature for the detected current measurement error in the feedback mode, as shown at 830. The failure signature extraction includes calculating the phase and magnitude of the error (differences) in the measured current values 124 and estimated current values that are based on the current commands 122.

The method further includes determining the failed component when operating in the feedforward mode as described further. The method further proceeds by the control diagnostic module determining if the failure is a single point failure or a multi-point failure, as shown at 840. The determination is done in the feedforward mode. For example, in the steering system, the determination is done using input current command in the feedforward command generated by the current regulator 104 based on a torque command, and the final current command is configured to be sent to the motor 110 and is based on the measurement of motor current. A single point failure includes a failure at a single current measurement component, and a multi-point failure includes multiple components failing. In one or more examples, the determination is based on a phase of the current difference 632.

If the failure is a multi-point failure, the method proceeds by indicating that multiple components have experienced a failure, as shown at 850. In this case, the method includes setting the feedforward operating mode permanently, as shown at 852. Further, in one or more examples, the method includes sending signal for system shutdown, as shown at 854. Alternatively, for example in applications such as the steering system 12, the method includes sending a signal indicating a loss of assist mitigation to indicate that torque assist is no longer available for the operator.

If the failure is a single point failure, the method proceeds by indicating that a single component has experienced a failure, as shown at 860. The method further proceeds to identify the failed component when operating in the feedforward mode as described herein, as shown at 862. Upon identifying the failed component, the method further includes switching back to feedback operating mode, as shown at 864. For example, the switch is performed by sending the diagnostic flag 130 value to cause the current regulator 104 to select the feedback control. In addition, the method includes setting arbitration to use only healthy signals and not use current measurements from the failed component for the feedback control, as shown 866. It should be noted that, if this is second (or later) single point failure, the method proceeds according to the multi-point failure described herein (850).

The technical solutions described herein facilitate detecting presence of an offset error from the current difference magnitude and also detect the specific failed sensor from the current difference phase. The technical solutions described herein facilitate determining the failed component in feedforward mode operation of the motor control system, where the motor control system is switched to the feedforward mode from a feedback mode in which the failure is detected. Note that the specific value of the failed sensor identifier indicates a failure on a specific phase of the motor control system, for example phase a, phase b, or any other phase. The technical solutions facilitate detecting if the current measurement hardware has experienced a single point failure or a multi-point failure. In case of a single point failure the technical solutions facilitate using the healthy components to continue operation in a feedback control mode. In case of a multi-point failure, the technical solutions continue operation in a feedforward mode, which has a slower dynamic response than the feedback mode. Further, in case of a multi-point failure, the technical solutions may cause a motor control system to shutdown. In case the motor control system is being used for providing assist torque or any other such application, the technical solutions facilitate providing a signal indicating that such assist torque from the motor is no longer available, which can be used to provide an indication (visual/audio) to an operator.

The technical solutions described herein facilitate detecting current measurement errors in feedforward control mode using current values, and identifying specific sensors that have failed, including ability to detect multiple simultaneous failures. The technical solutions further facilitate utilizing healthy sensors (depending on the nature of the current measurement subsystem) after failure identification. Further, the technical solutions facilitate transitioning a motor control system to feedback control mode after the faulted sensor detection in systems with in-line phase current measurements. Further yet, the technical solutions employ algorithms such as machine parameter learning to enhance the system performance in systems with low-side current measurement.

The present technical solutions may be a system, a method, and/or a computer program product at any possible technical detail level of integration. The computer program product may include a computer readable storage medium (or media) having computer readable program instructions thereon for causing a processor to carry out aspects of the present technical solutions.

Aspects of the present technical solutions are described herein with reference to flowchart illustrations and/or block diagrams of methods, apparatus (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present technical solutions. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession, in fact, may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will also be appreciated that any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Such computer storage media may be part of the device or accessible or connectable thereto. Any application or module herein described may be implemented using computer readable/executable instructions that may be stored or otherwise held by such computer readable media.

While the technical solutions are described in detail in connection with only a limited number of embodiments, it should be readily understood that the technical solutions are not limited to such disclosed embodiments. Rather, the technical solutions can be modified to incorporate any number of variations, alterations, substitutions, or equivalent arrangements not heretofore described, but which are commensurate with the spirit and scope of the technical solutions. Additionally, while various embodiments of the technical solutions have been described, it is to be understood that aspects of the technical solutions may include only some of the described embodiments. Accordingly, the technical solutions are not to be seen as limited by the foregoing description.

What is claimed is:

1. A system for determining a sensor failure in a motor control system with at least three phase current measurements, the system comprising:
   a current controller configured to generate an input voltage command for a motor using feedforward control;
   a failed sensor identification module, in response to the current controller operating using the feedforward control, configured to:
     determine that a current offset error is indicative of a failure of a current sensor, the current offset error determined based on a magnitude and a phase of a diagnostic current; and
     determine that the current offset error is indicative of a multi-point failure based on a determination that the magnitude of the diagnostic current is above a first predetermined threshold, and that the current offset error is indicative of a single point failure based on a determination that the magnitude is between a second predetermined threshold and the first predetermined threshold.

2. The system of claim 1, further comprising:
   a control mode arbitration module configured to switch the current controller to operate using feedback control in response identification of the current sensor experiencing the failure.

3. The system of claim 2, further comprising a healthy measurement arbitration module that modifies a calculation scheme for determining a measured motor current based on identification of the current sensor experiencing the failure.

4. The system of claim 2, wherein the control mode arbitration module is further configured to switch the current controller to operate in the feedforward control in response to detection of the current offset error.

5. The system of claim 1, wherein in response to the multi-point failure, a current diagnostic module is configured to send a system shutdown signal.

6. The system of claim 1, wherein in response to the multi-point failure, a current diagnostic module configures the current controller to operate using the feedforward control permanently.

7. The system of claim 1, wherein failed sensor identification module is further configured to:
   calculate detection windows respective to each phase in the motor control system; and
   identify, from a plurality of current sensors, the current sensor experiencing the failure based on a phase value of the diagnostic current being in one of the detection windows.

8. A method for determining a sensor failure in a motor control system with at least three phase current measurements, the method comprising:
   generating, by a current controller module, an input voltage command for a motor using feedforward control based on a measured motor current; and
   identifying, by a failed sensor identification module, a specific current sensor that is experiencing a failure while the motor control system operates using the feedforward control, the identification comprising:
     determining that the current offset error is indicative of the failure based on a magnitude of a diagnostic current; and
     determining that the current offset error is indicative of a multi-point failure based on a determination that the magnitude of the diagnostic current is above a first predetermined threshold, and that the current offset error is indicative of a single point failure based on a determination that the magnitude is between a second predetermined threshold and the first predetermined threshold.

9. The method of claim 8, further comprising switching, by a control mode arbitration module, the current controller to operate using feedback control in response the identification of the current sensor experiencing the failure.

10. The method of claim 8, further comprising, modifying, by a healthy measurement arbitration module, a calculation scheme for determining a measurement of the measured motor current based on the current sensor experiencing the failure, the modified calculation scheme does not use, for feedback control, measurements from the current sensor experiencing the failure.

11. The method of claim 8, further comprising, in response to the multi-point failure, sending a system shutdown signal.

12. The method of claim 8, further comprising:
   switching, by a control mode arbitration module, the current controller to operate using feedforward control in response to detection of the current offset error.

13. A motor control system, comprising:
   a motor;
   a current controller module configured to generate an input voltage command for the motor using feedback control based on a measured motor current;
   a current measurement and diagnostic calculation module configured to detect an offset error; and
   a failed sensor identification module configured to, in response to the offset error:
     switch the current controller module to operate using feedforward control; and determine, when operating in the feedforward control, a failure based on a magnitude of a diagnostic current being above a first predetermined threshold, and in response identify, from a plurality of current sensors, a current sensor that is experiencing the failure based on a phase value of the diagnostic current.

14. The motor control system of claim 13, further comprising a control selector module that is configured to switch the current controller module to operate using feedback control in response identification of the current sensor experiencing the failure.

15. The motor control system of claim 13, further comprising a healthy measurement arbitration module that modifies a calculation scheme for determining a measurement of the measured motor current based on the current sensor experiencing the failure being identified.

16. The motor control system of claim 13, wherein the failed sensor identification module is configured to determine a multi-point failure based on the magnitude of the diagnostic current in the feedforward control being above the first predetermined threshold, and a phase of the diagnostic current not being in a set of predetermined detection windows, and in response initiate a system shutdown.

17. A system for determining a sensor failure in a motor control system with at least three phase current measurements, the system comprising:
   a current controller configured to generate an input voltage command for a motor using feedforward control;
   a failed sensor identification module, in response to the current controller operating using the feedforward control, configured to:
      determine that a current offset error is indicative of a failure of a current sensor, the current offset error determined based on a magnitude and a phase of a diagnostic current; and
      determine that the current offset error is indicative of a multi-point failure based on a determination that the magnitude of the diagnostic current is above a first predetermined threshold.

18. A system for determining a sensor failure in a motor control system with at least three phase current measurements, the system comprising:
   a current controller configured to generate an input voltage command for a motor using feedforward control;
   a failed sensor identification module, in response to the current controller operating using the feedforward control, configured to:
      determine that a current offset error is indicative of a failure of a current sensor, the current offset error determined based on a magnitude and a phase of a diagnostic current; and
      determine that the current offset error is indicative of a single point failure based on a determination that the magnitude is between a first predetermined threshold and a second predetermined threshold.

19. The system of claim 18, wherein the failed sensor identification module is configured to identify, from a plurality of current sensors, the current sensor experiencing the single point failure based on a phase value of the diagnostic.

20. The system of claim 18, further comprising:
   a control mode arbitration module configured to switch the current controller to operate using feedback control in response identification of the current sensor experiencing the single point failure.

* * * * *